(12) United States Patent
Franca-Neto (10) Patent No.: US 6,806,777 B2
(45) Date of Patent: Oct. 19, 2004

(54) ULTRA WIDE BAND LOW NOISE AMPLIFIER AND METHOD

(75) Inventor: Luiz M. Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/336,341

(22) Filed: Jan. 2, 2003

(65) Prior Publication Data

US 2004/0130398 A1 Jul. 8, 2004

(51) Int. Cl.[7] .................................................. H03F 3/04
(52) U.S. Cl. ...................................... 330/311; 330/302
(58) Field of Search ................................ 330/311, 302, 330/277

(56) References Cited

U.S. PATENT DOCUMENTS

| | | | | |
|---|---|---|---|---|
| 3,628,166 A | * | 12/1971 | Harford ........................ 330/109 |
| 4,835,485 A | * | 5/1989 | Mueller ........................ 330/277 |
| 5,920,230 A | * | 7/1999 | Beall ............................. 330/54 |
| 6,351,632 B1 | * | 2/2002 | Yan et al. ..................... 455/333 |
| 6,400,227 B1 | * | 6/2002 | Goldfarb et al. ............. 330/295 |
| 6,429,742 B1 | | 8/2002 | Franca-Neto ................ 330/254 |

* cited by examiner

Primary Examiner—Patricia Nguyen
(74) Attorney, Agent, or Firm—Schwegman, Lundberg, Woessner & Kluth, P.A.

(57) ABSTRACT

An ultra wide band (UWB) low noise amplifier (LNA) includes a common-gate (CG) amplifying element in cascode with a common-source (CS) amplifying element, and a load-tracking (LT) network to, at least in part, track a changing output impedance of the cascode helping to provide a substantially constant gain over an ultra wide frequency band of interest. The LT network may include of a parallel combination of a capacitive element, an inductive element, and a resistive element, which may be selected to, at least in part, track the changing output impedance of the cascode over an ultra wide frequency band. An initial common-gate stage may compensate for a capacitive input impedance of the cascode and may provide a substantially matched antenna input over the ultra wide frequency band. The amplifier may also include one or more resistor-based amplifying stages after the cascode.

30 Claims, 7 Drawing Sheets

ULTRA WIDE BAND LOW NOISE AMPLIFIER AND METHOD

TECHNICAL FIELD

Embodiments of the present invention pertain to radio-frequency (RF) amplifiers, and in particular, to wide band and ultra wide band (UWB) amplifiers for on-chip receivers.

BACKGROUND

A low noise figure in receivers helps to accurately detect signals. This is especially true for single receivers that may be used to receive signals within a wide or an ultra wide frequency band. Ultra wide band refers to a frequency band used as a wireless communication channel, which may range, for example, from 3 GHz to 10 GHz. To achieve a low noise figure, low-noise amplification of the received signals may be performed from an antenna input. Conventional wide band amplifiers have used resistive feedback to help achieve wide band response and improve amplifier stability. One problem with the use of resistive feedback is that noise levels may become unsuitable for use in many receivers, especially wide band and receivers. Another problem with the use of resistive feedback is that resistive feedback may result in input impedance values that are unsuitable for wide band receiver front ends. Reactive feedback has also been used to overcome some of the problems with resistive feedback, however the use of reactive feedback is generally not suitable for wide band applications. This is particularly true in the case of ultra wide band amplification where the higher frequencies to be amplified may be around the limits of frequency response of the transistors used in the design. Thus there is a general need for an improved ultra wide band amplifier. There is also a need for an ultra wide band amplifier with improved noise performance. There is also a need for an improved receiver.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents.

Figure 1:
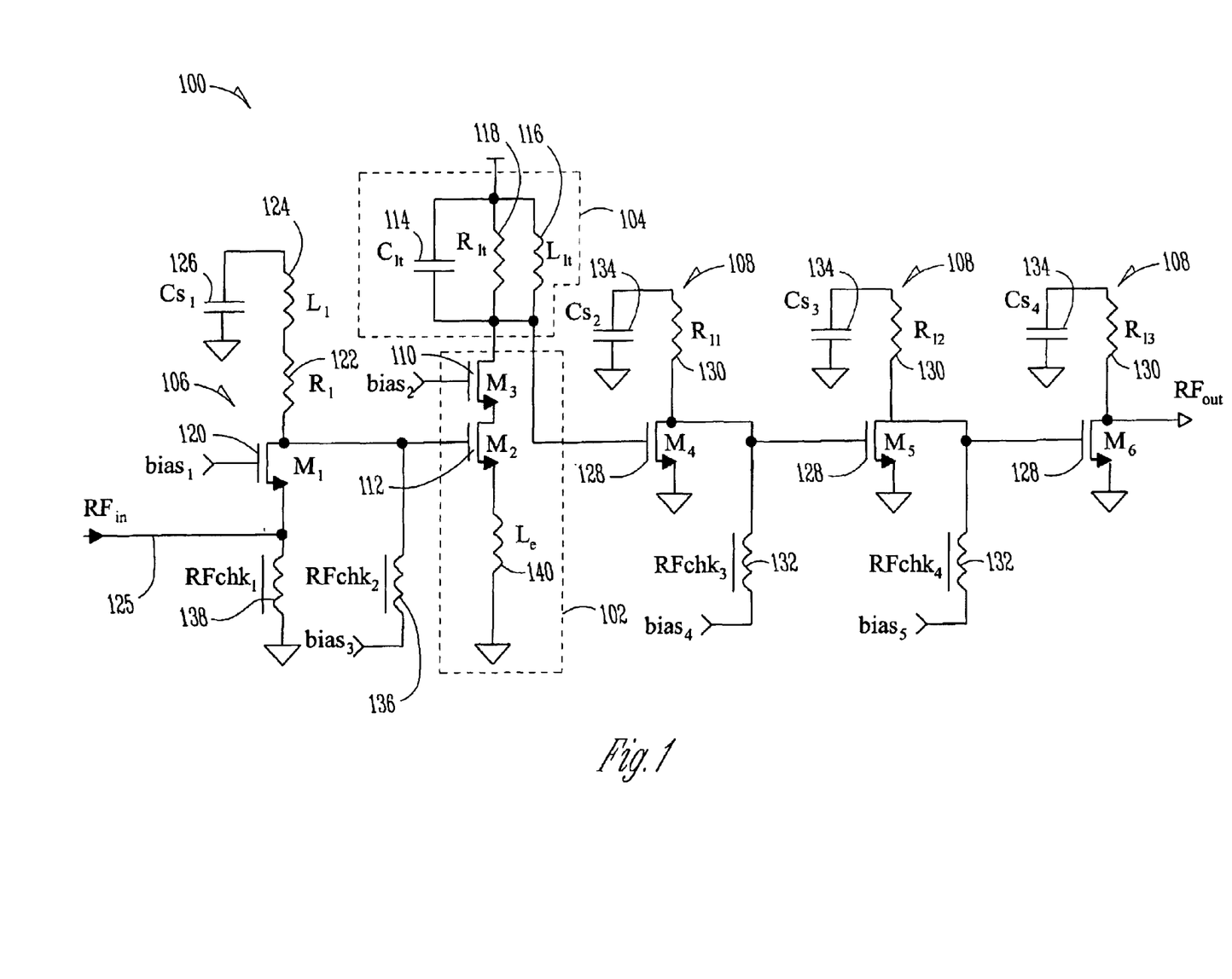
FIG. 1 is a simplified circuit diagram of an ultra wide band low noise amplifier in accordance with an embodiment of the present invention.

FIG. 1 is a simplified circuit diagram of an ultra wide band low noise amplifier in accordance with an embodiment of the present invention. Amplifier 100 may be suitable for amplification of RF signals, and in particular, suitable for amplification of wide band and ultra wide band signals. Amplifier 100 may also be suitable for on-chip receivers, and receivers where low noise figure is desired. Bias circuitry for amplifier 100 is not illustrated for clarity.

Amplifier 100 is comprised of cascode 102 with load tracking (LT) network 104. Cascode 102 may be inductive source degeneracy. Amplifier 100 may also include common-gate stage 106 and one or more additional amplification stages 108. Cascode 102 is comprised of amplifying element 110 in a cascode with amplifying element 112. Amplifying element 110 is in a common gate (CG) arrangement and amplifying element 112 is in a common-source (CS) arrangement.

LT network 104 may be comprised of a parallel combination of LT capacitive element 114, LT inductive element 116, and LT resistive element 118, although other combinations of load tracking elements are also suitable. LT inductive element 116, LT capacitive element 114 and LT resistive element 118 may form a resonant circuit within an ultra wide frequency band. In accordance with embodiments of the present invention, values of the LT elements may be selected to, at least in part, track a changing output impedance of cascode 102 over an ultra wide frequency band. This may achieve a substantially constant gain broad output response over the frequency band. This selection of load tracking elements may be performed by an iterative or trial-and-error process, which is described in more detail below. In some embodiments, the ultra wide frequency band may range between 3 and 10 GHz or more, although other frequency ranges are also suitable. In a 3 to 10 GHz embodiment, for example, the gain variation may be within 1.5 dB throughout the pass band. Although embodiments of the present invention are described for wide and ultra wide frequency bands, these embodiments are equally suitable for frequency bands smaller than a wide or ultra wide band.

As illustrated, a source of amplifying element 110 is coupled to a drain of amplifying element 112, and a drain of amplifying element 110 is coupled to LT network 104. A gate of amplifying element 112 may receive an RF input signal, and the drain of amplifying element 110 may provide an amplified RF output signal within an ultra wide frequency band.

In at least one embodiment, cascode 102 and LT network 104 may comprise a second stage of amplifier 100. In this embodiment, common-gate stage 106 may be included to provide an RF input signal to cascode 102. Common-gate stage 106 may be comprised of amplification element 120, resistive element 122 and inductive element 124. Elements 122 and 124 may be selected to at least in part compensate for a capacitive input impedance of cascode 102 and to provide a substantially matched input over an ultra wide frequency band. In one embodiment, stage 106 may transform the input impedance of cascode 102 to a matched impedance of about 50 Ohms suitable for coupling with antenna terminal 125. Capacitive element 126 functions as an RF short within the ultra wide frequency band and provides DC isolation for the drain of element 120. Resistive element 122 may range approximately between 100 and 200 Ohms, and inductive element 124 may range approximately between 0.5 and 3 nH, although other values may also be suitable depending on the devices and fabrication technique. In one embodiment, resistive element 122 and inductive element 124 may be placed in parallel with RF choke 138 eliminating the need for capacitive element 126.

Additional amplification stages 108 be resistor-based broadband amplifiers and may be noisier and have lower gain than cascode 106. Stages 108 may be biased via the RF-chokes. In some embodiments, amplification stages 108 may include amplification elements 128 and resistive elements 130 coupled with the drains of amplification elements 128. Capacitive elements 134 may provide an RF short to ground. Some of amplification stages 108 may also include RF chokes 132, and in one embodiment, resistive elements 130 may be coupled in parallel to RF chokes 132 which may eliminate the need for capacitive elements 134.

In one embodiment, a plurality of amplification stages 108 may be arranged in parallel. In this embodiment, amplification stages 108 of the plurality may be coupled to the output of cascode 102 providing a plurality of amplified RF signals.

The noise figure of amplifier 100 may primarily be determined by cascode 102 even though amplification stages 108 may be noisy, making amplifier 100 suitable for use in wide band and ultra wide band receivers. In one embodiment, amplifier 100 may provide a gain of between 20 and 40 dB with less than 1.5 dB of variation across a 3 to 10 GHz ultra wide frequency band. In these embodiments, amplifier 100 may achieve an input return loss of at least −15 dB providing a matched antenna input. In these embodiments of the present invention, amplifying elements 110, 112, 120 and 128 may be CMOS FETs although other types of transistors may also be suitable.

In one embodiment using 0.09 $\mu$m high performance digital CMOS technology, amplifying elements 110, 112, 120 and 128 may have a width to length (W/L) ranging between approximately 45–50/0.09 ($\mu$m/$\mu$m). Nothing requires that amplifying elements 128 be the same size as amplifying elements 110 and 112, and in one embodiment, amplifying elements 128 may be smaller than amplifying elements 110 and 112. Various embodiments of amplifier 100 may be fabricated on a single semiconductor die, although embodiments are equally suitable to fabrication with combinations of discrete elements and components.

LT inductive element 116 may have an inductance significantly greater than a parasitic inductance of the amplifying elements of cascode 102, and in one embodiment, may have a value ranging from approximately 3 to 10 nH. In this embodiment, LT capacitive element 114 may have a value ranging from approximately 0.5 to 1.5 pF, and LT resistive element 118 may have a value ranging from approximately 30 and 150 Ohms.

In embodiments, LT resistive element 118 does not necessarily function as a parasitic Q-lowering resistor for LT inductive element 116 and may be an explicit resistor (e.g., not a parasitic resistance). Resistive element 118 may be comprised of either a polycrystalline resistor, an n-Well resistor or special layer integrated resistor, although other resistor types are also suitable. LT capacitive element 114 may be a metal-insulator-metal (MIM) capacitor fabricated on or near a surface of a semiconductor die comprising the amplifying elements although other types of capacitors, including MOS-caps may also suitable. LT inductive element 116 may be almost any type of inductive element including a spiral inductor.

In one embodiment, amplification element 112 may receive a bias voltage through RF choke 136, amplification element 110 may receive a bias voltage at its gate node, amplification element 120 may receive a bias voltage at its gate node, and amplification elements 128 may receive a bias voltage through RF chokes 132. The value of the bias voltage may depend on, among other things, the process used to fabricate the devices and desired performance. In one embodiment the bias voltage may be approximately −1.2 volts for elements 128. The RF chokes may lower the power dissipation of amplifier 100 allowing the use of a very low supply voltage. In an embodiment of the present invention, which operates over an ultra wide frequency band from about 3 to 10 GHz, the RF chokes may have values on the order of 10 nH and may provide impedances much larger than 50 Ohms at the node they are coupled with to cover the band of operation. In one embodiment, three metal layer RF chokes fabricated with a CMOS process may be suitable. In one embodiment, the resistive elements 130 may be placed in parallel with RF chokes 132 of corresponding amplification stages 108. In one embodiment, cascode 102 may also include source inductor 140 used for matching to reduce the capacitive input of the cascode.

In other embodiments, combinations other than the combination illustrated by LT network 104 may be used for a LT network. For example, additional capacitive and inductive elements may be used in series with a resistive element, an inductive element and/or a capacitive element. In one embodiment, stages 108 are optional.

In an alternate embodiment of the present invention, cascode 102 of amplifier 100 may be replaced with a different amplifying structure, such as a single transistor. In this alternate embodiment, the a LT network similarly is selected to, at least in part, track the changing output impedance of the different amplifying structure over an ultra wide frequency band to broaden an output response within the frequency band. This may provide substantially constant gain over the broadened response.

Figure 2:
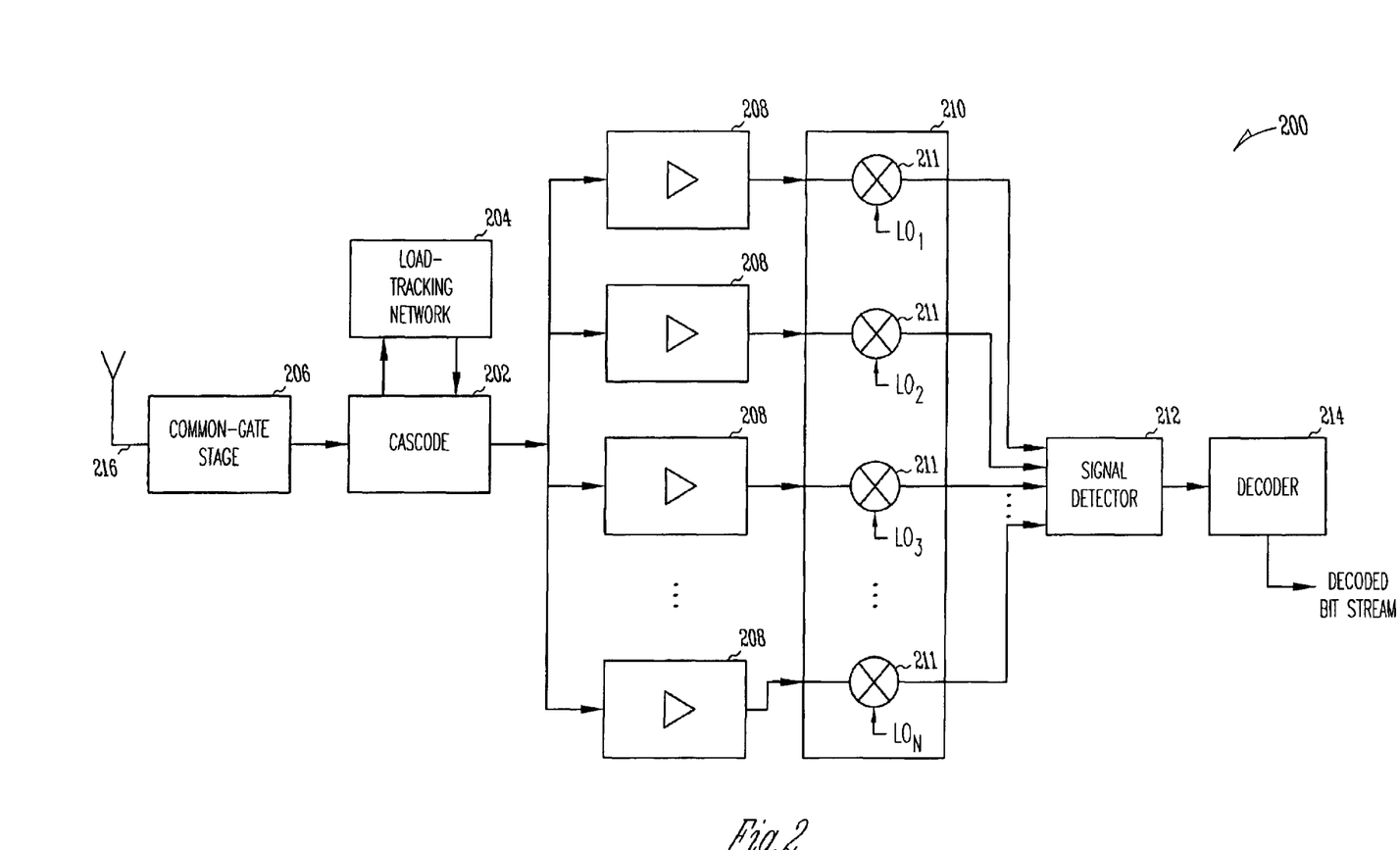
FIG. 2 is a block diagram of a receiver system in accordance with an embodiment of the present invention.

FIG. 2 is a block diagram of a receiver system in accordance with an embodiment of the present invention. Receiver system 200 may receive RF signals, and in some embodiments, may receive RF signals in a wide frequency band or an ultra wide frequency band. Receiver 200 may be suitable for use in any wireless communication device or any processing system that may receive wireless signals. Receiver system 200 converts received RF signals into a digital bit stream for use by other elements of the communication device or processing system. The digital bit stream may represent any communicated information including voice, data, or video information.

Receiver system 200 may receive RF signals that have been transmitted in accordance with many various communication techniques. Examples of some suitable communication techniques may include digital and analog wireless communication techniques including code division multiple access (CDMA) techniques, wide band CDMA (WCDMA) techniques, or frequency division multiple access (FDMA) techniques, and/or time-division multiple access (TDMA) techniques. In some embodiments, system 200 may receive communications in accordance with various communication standards and protocols including, for example, a wireless application protocol (WAP), or i-Mode protocol. Other examples of communications that system 200 may receive may include the many digital mobile communication standards, such as the Global System for Mobile Communications (GSM), and communications in accordance with packet radio services such as the General Packet Radio Service (GPRS) packet data communication service. In one embodiment of the present invention, system 200 may receive communications in accordance with the Universal Mobile Telephone System (UMTS) for the next generation of GSM, which may, for example, implement the International Mobile Telecommunications for the year 2000 (IMT-2000) family of third-generation (3G) wireless standards. In this embodiment, one or more of external communication networks may provide packet data services (PDS) utilizing packet data protocols (PDP). In other embodiments, system 200 may receive communications in accordance with a multi-carrier transmission technique, such as an orthogonal frequency division multiplexing (OFDM) technique that uses orthogonal subcarriers to transmit information within an assigned spectrum. System 200 may also receive RF signals in accordance with one or more communication standards for wireless local area network (WLAN) communications, including, for example one or more of the IEEE 802.11(a), 802.11(b) and/or 802.11(g) (ANSI/IEEE 802.11, 1999 edition, and as subsequently amended) standards for wireless local area network standards, Bluetooth, the Digital Video Broadcasting Terrestrial (DVB-T) broadcasting standard, and/or the High performance radio Local Area Network (HiperLAN) standard. In embodiments, system 200 may receive UWB wireless communications using simultaneous multi-tone transmissions.

Depending on the type of signals to be received, receiver 200 may have different elements and a different arrangement of elements than the illustrated embodiment. Although system 200 is illustrated as having several separate functional elements, one or more of the functional elements may be combined and may be implemented by combinations of software configured elements, such as processors including digital signal processors (DSPs), and/or other hardware elements.

Receiver 200 may receive an RF signal using antenna 216, which provides the received RF signal to an amplifier comprised of common-gate (CG) stage 206, cascode 202, load-tracking (LT) network 204 and one or more amplification stages 208. The amplifier may be a wide band or ultra wide band low noise amplifier, and in one embodiment, common-gate stage 106 (FIG. 1) may be suitable for use as stage 206, cascode 102 (FIG. 1) may be suitable for use as cascode 202, LT network 104 (FIG. 1) may be suitable for use as LT network 204, and resistor based amplification stages 108 (FIG. 1) may be suitable for use as amplification stages 208, although other devices and elements may also be suitable for use in receiver 200.

Antenna 216 may be a dipole antenna, a monopole antenna, a loop antenna, a microstrip antenna or other type of antenna suitable for reception and/or transmission of RF signals, which may be processed by receiver 200. Amplification stages 208 provide amplified RF signals to down converter 210, which may down convert the RF signals to an intermediate frequency (IF) signal for detection by signal detector 212. Decoder 214 may decode signal bits generated by signal detector 212 to provide a decoded bit stream.

In one embodiment, a plurality of amplification stages 208 may be included in receiver 200. In this embodiment, amplification stages 208 may receive an amplified RF signal from cascode 202 and provide a further amplified signal to a corresponding one of mixing elements 211, which may down convert the signals for signal detection. Mixing elements 211 may provide different local oscillator (LO) frequencies allowing mixing elements 211 to down convert different portions of a frequency band. In this embodiment, signal detector 212 may receive an output from each of mixing elements 211 and generate a detected bit stream. The use of a plurality of down converting elements may improve signal detection across a wide or ultra wide frequency band. In this embodiment, stages 208 may include one or more additional amplification stages therein, such as stages 108 (FIG. 1). In another embodiment, amplification stages 208 may be optional.

In embodiments, the various elements of receiver 200, except for possibly antenna 216, may be fabricated on a single semiconductor die, and may allow a UWB receiver to be fully integrated in CMOS technology. The use of a low noise amplifier that includes cascode 202, LT network 204 and CG stage 206, allows receiver 200 to operate with a low noise figure, which may be comparable to that of narrow-band receivers. Accordingly receiver 200 may even provide improved signal detection and improved sensitivity over a wide or ultra wide band allowing for greater communication data rates.

Figure 3:
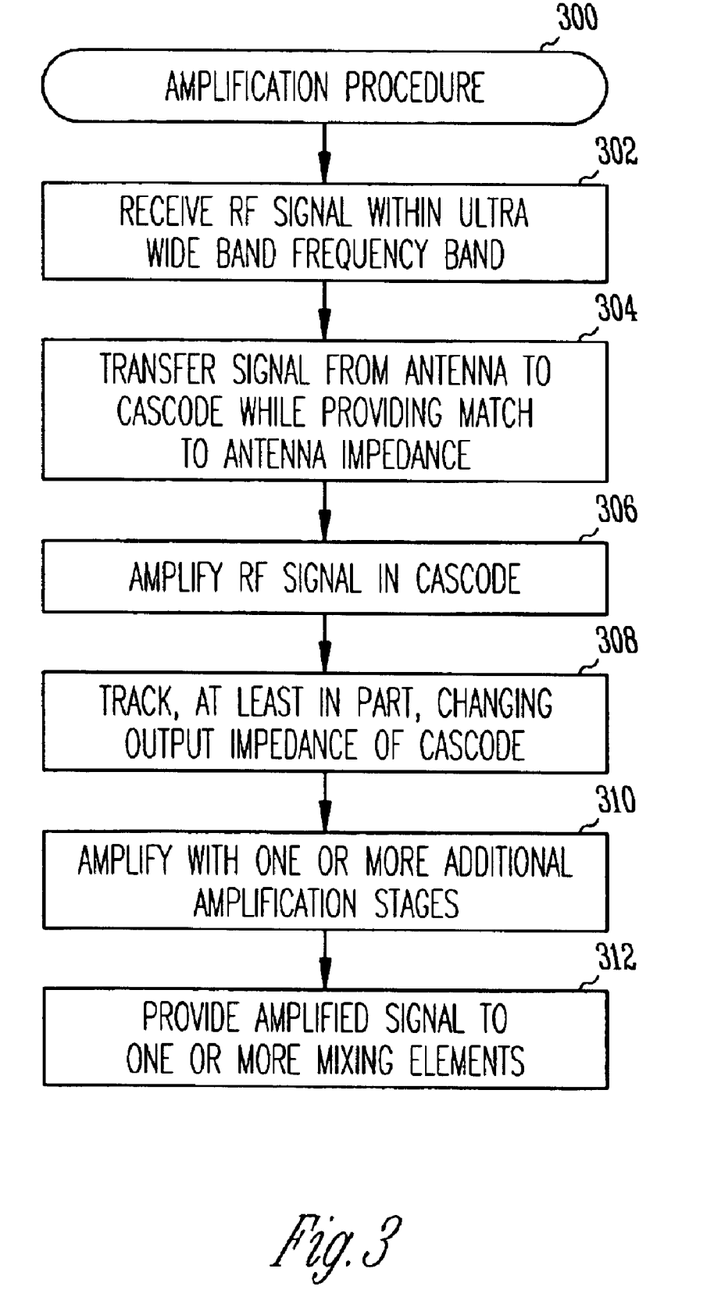
FIG. 3 is a flow chart of an amplification procedure in accordance with an embodiment of the present invention.

FIG. 3 is a flow chart of an amplification procedure in accordance with an embodiment of the present invention. Procedure 300 may be performed by an amplifier such as amplifier 100 (FIG. 1) although other amplifiers may also be suitable for performing procedure 300. Portions of procedure 300 may also be performed by receiver 200 (FIG. 2). Although the individual operations of procedure 300 are illustrated and described as separate operations, one or more of the individual operations may be performed concurrently and nothing requires that the operations be performed in the order illustrated.

In operation 302, an RF signal may be received. The RF signal may be within a wide or ultra wide frequency band. In an embodiment, the RF signal may be received at antenna terminal 125 (FIG. 1) of amplifier 100. The received RF signal may be in accordance with one or more of the various communication techniques previously described.

In operation 304, the received signal is transferred from the antenna terminal to the input of a cascode, such as cascode 102 (FIG. 1). Operation 304 may be performed by a common gate (CG) stage, such as stage 106 (FIG. 1) which may transform the input impedance of the cascode into an impedance at the antenna terminal, which may be about 50 Ohms.

In operation 306, the RF signal is amplified in a low-noise amplification stage such as a cascode. A cascode, such as cascode 102 (FIG. 1) may be suitable for performing operation 306. In operation 308, an output impedance of the cascode may be tracked, at least in part, with a load-tracking network, such as LT network 104 (FIG. 1). In operation 308, the load may change with the changing output impedance of the cascode allowing the output of the cascode to drive a substantially matched load, at least in portions of the wide or ultra wide frequency band. Accordingly, operations 306 and 308 may provide an amplified RF signal within a wide or ultra wide frequency band. In embodiments, an ultra wide frequency band may be at least approximately 3 to 10 GHz, although embodiments of the present invention are also suitable over higher frequency wide and ultra wide frequency bands.

In operation 310, the amplified signal from the cascode may be amplified in one or more additional amplification stages. The additional amplification stages may be resistor-based amplification stages, such as stages 108 (FIG. 1). The additional amplification stages may be arranged serially as illustrated in FIG. 1. In another embodiment, the additional amplification stages may be arranged in a parallel configuration generating a plurality of amplified signals, for example, as illustrated by amplification stages 208 (FIG. 2).

In operation 312, the RF signals amplified by the additional amplification stages may be provided to one or more mixing elements, depending on the embodiment, for down conversion and eventual signal detection and decoding.

Figure 4A:
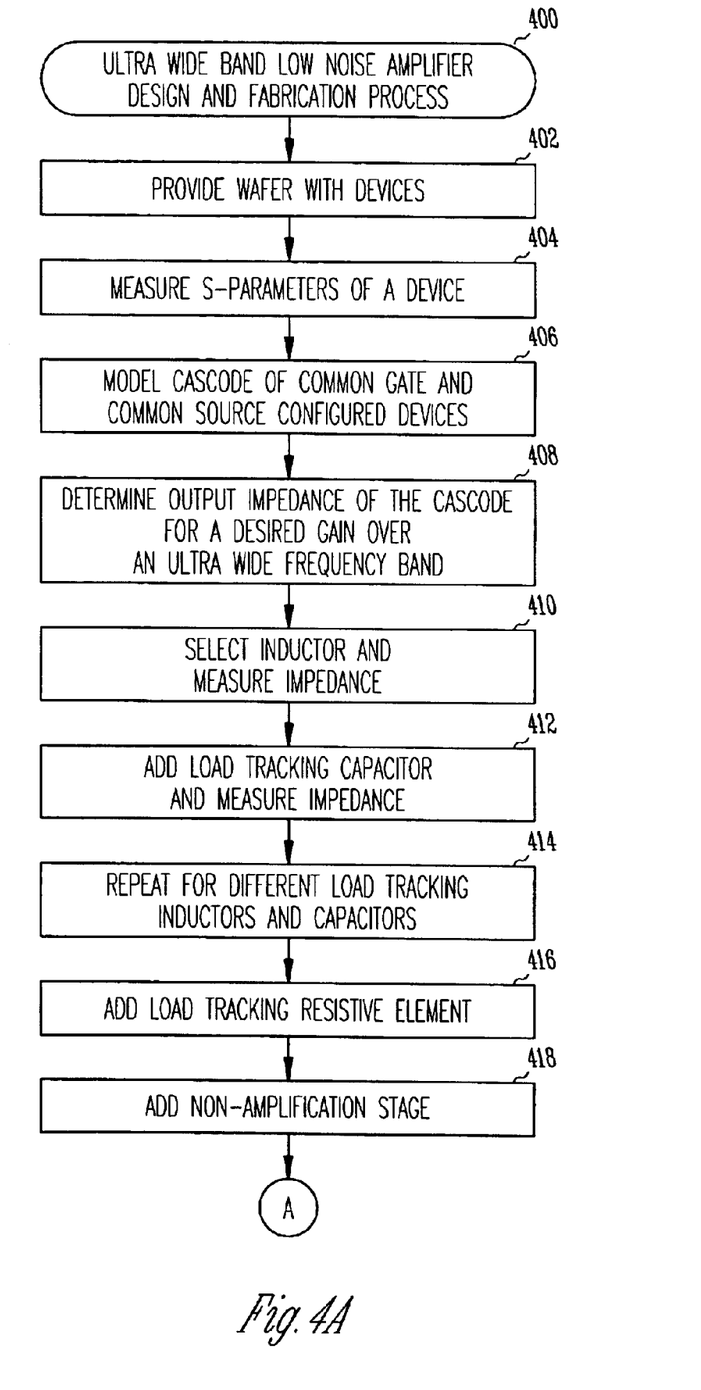
FIG. 4A and FIG. 4B are a flow chart of a design and fabrication procedure in accordance with an embodiment of the present invention.
Figure 4B:
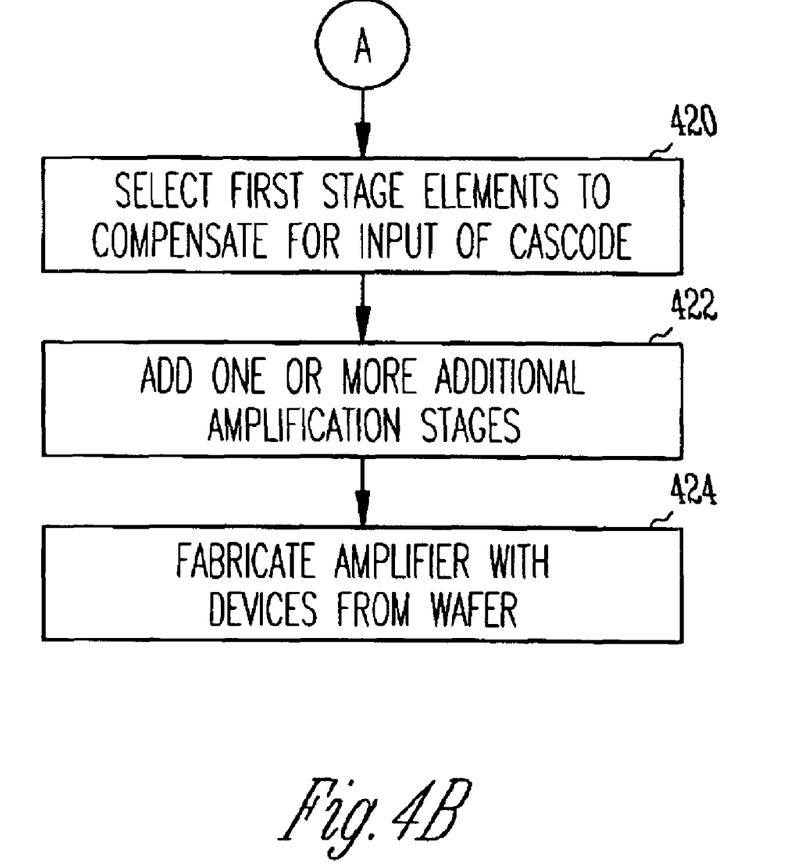

FIG. 4A and FIG. 4B are a flow chart of a design and fabrication procedure in accordance with an embodiment of the present invention. Design and fabrication procedure 400 may be performed as part of a design process used to design and fabricate an amplifier, such as amplifier 100 (FIG. 1), although procedure 400 may be used to design and fabricate other amplifier configurations. Portions of procedure 400 may be automated, while other portions may be performed manually. In one embodiment, a software program can be combined with hardware for performing operations of procedure 400 to generate an amplifier design. Although the individual operations of procedure 400 are illustrated and described as separate operations, one or more of the individual operations may be performed concurrently and nothing requires that the operations be performed in the order illustrated.

In operation 402, a semiconductor wafer is provided. The semiconductor wafer may be fabricated with a processing technique, such as CMOS process and may have devices (such as FETs) thereon suitable for use in an amplifier, such as amplifier 100. In operation 404, the S-parameters of an amplification element are measured. Operation 404 may be performed over a desired frequency band, such as a wide or ultra wide frequency band, and may be performed for particular bias conditions for the active elements.

In operation 406, a model of a cascode may be generated using the S-parameters. The cascode comprised common-gate amplifying element with a common-source amplifying element. An example of a suitable cascode is cascode 102 (FIG. 1).

In operation 408, the output impedance of the cascode may be determined from the model for a desired gain. In one embodiment, constant gain circles may be generated on a Smith chart for selected frequencies in a wide or ultra wide frequency band.

Figure 5:
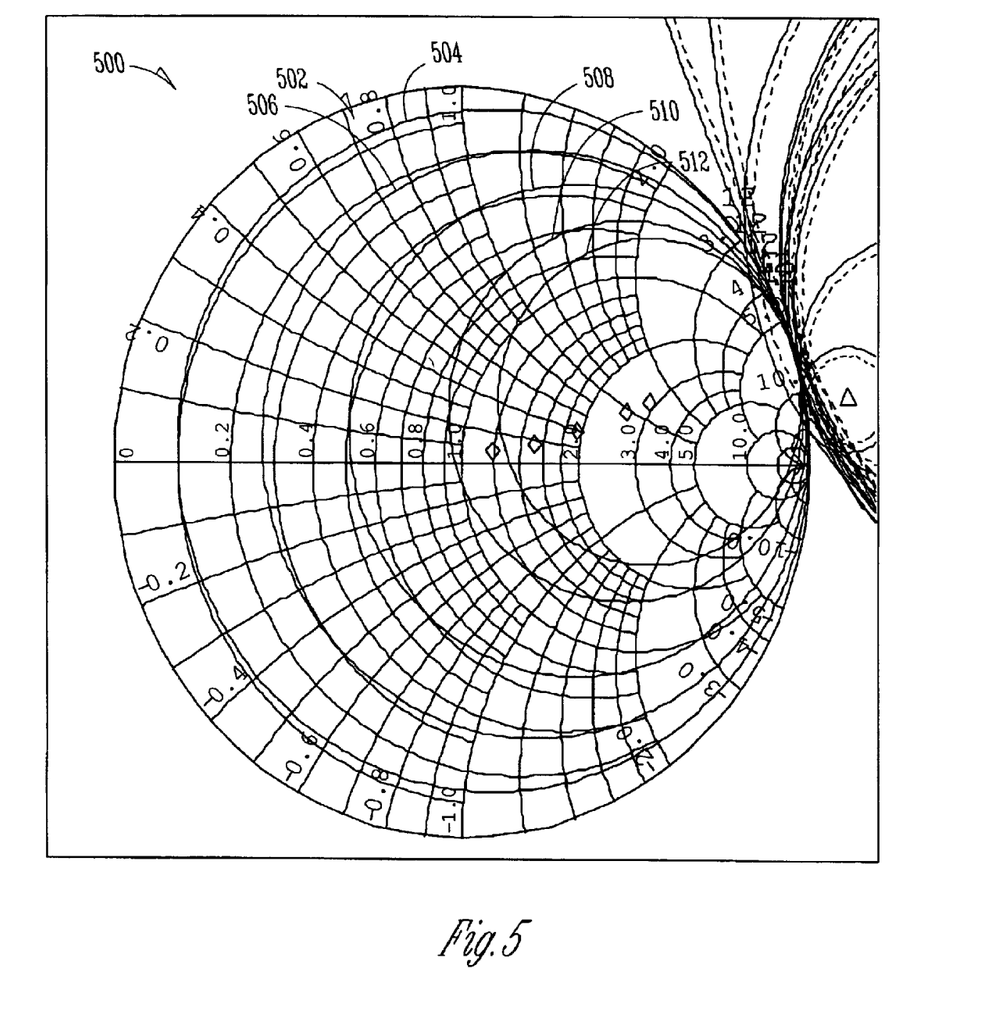
FIG. 5 is a Smith chart illustrating constant gain circles at selected frequencies for a cascode in accordance with an embodiment of the present invention.

FIG. 5 is a Smith chart illustrating constant gain circles at selected frequencies for a cascode in accordance with an embodiment of the present invention. Constant gain circles 502 may define changing output impedances of the cascode to achieve a substantially constant desired gain at a particular frequency. An impedance falling on or near one of the constant gain circles may allow the cascode to provide the desired gain. In example Smith chart 500, each constant gain circle may allow the cascode to provide a gain of approximately 12 dB at a particular frequency. For example, constant gain circle 504 may allow the cascode to provide a gain of approximately 12 dB at about 3 GHz, constant gain circle 506 may allow the cascode to provide a gain of approximately 12 dB at about 5 GHz, constant gain circle 508 may allow the cascode to provide a gain of approximately 12 dB at about 7 GHz, constant gain circle 510 may allow the cascode to provide a gain of approximately 12 dB at about 9 GHz, and constant gain circle 512 may allow the cascode to provide a gain of approximately 12 dB at about 10 GHz. The frequencies may be selected within a wide or ultra wide frequency band. Other desired gains and frequencies may also be selected. The constant gain circles illustrate that gain broadening may be achieved with a load that tracks, at least in part, the changing output impedance of the cascode. In other words, it is desirable to terminate the cascode with a same-gain load.

Referring back to FIG. 4, in operation 410, an inductive element may be initially selected as a load, and its changing output impedance of the cascode may be measured over the frequency band. The measured inductor's output impedance may be compared with the desired output impedance indicated by constant gain circles 502 (FIG. 5) of the cascode structure.

Figure 6:
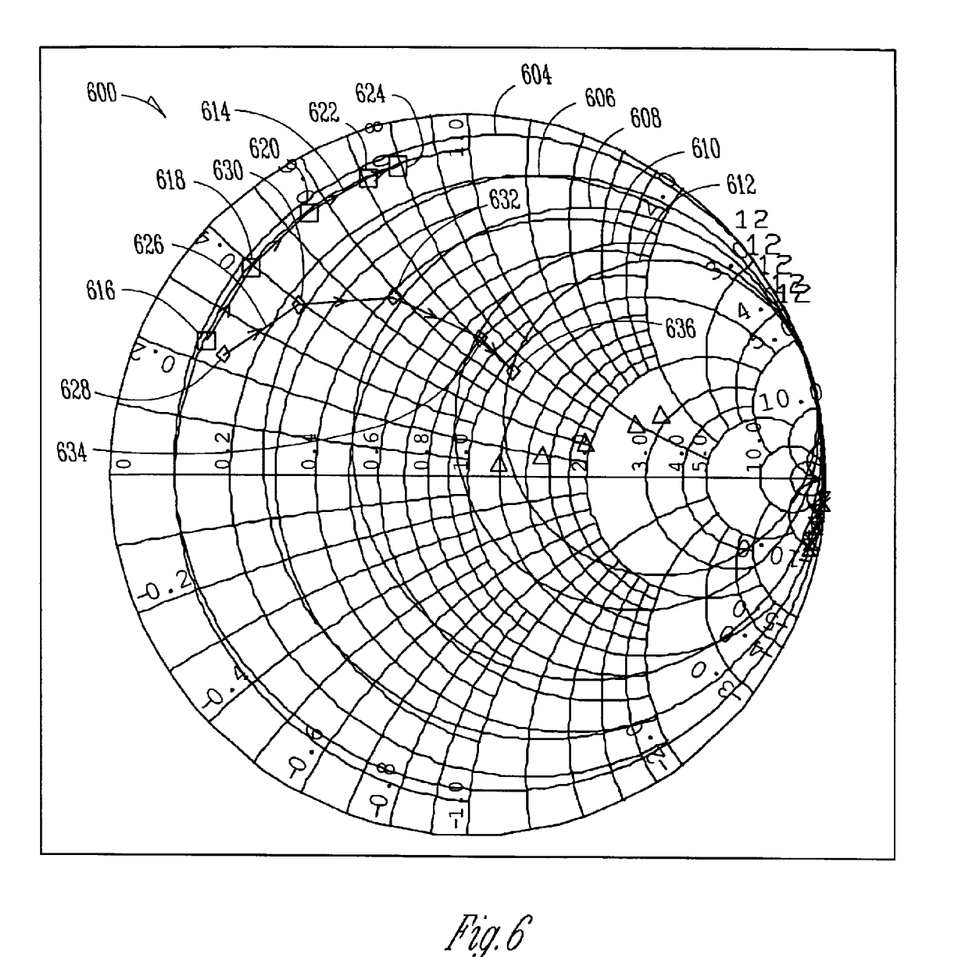
FIG. 6 is a Smith chart illustrating output impedances for a cascode with a load-tracking network in accordance with an embodiment of the present invention.

FIG. 6 is a Smith chart illustrating output impedances for a cascode with a load-tracking network in accordance with an embodiment of the present invention. Smith-chart 600 includes constant gain circles 604, 606, 608, 610 and 612 which correspond respectively with constant gain circles 504, 506, 508, 510 and 512 of Smith chart 500 (FIG. 5). Output impedance 614 illustrates an example of a measured load impedance for frequencies across the frequency band with an initially selected inductive element for use in a load-tracking network for the cascode. As illustrated, output impedance 614 does not track the desired output impedance very well. The initially selected inductive element has an output impedance at points 616, 618, 620, 622 and 624 for frequencies of about 3 GHz, 5 GHZ, 7 GHz, 9 GHz and 10 GHz, respectively, which at least for frequencies other than 3 GHz, the impedance 613 at the selected frequency does not lie near a constant impedance circle for that frequency. Because impedance 614 is in the top half of Smith chart 600, it is an inductive impedance and therefore, more capacitance may be required. In operation 412, a capacitive element may be in parallel with the inductive element in an attempt to bring impedance 614 more in line with the constant impedance circles 612.

Referring back to FIG. 4, in operation 414, the output impedance for various combinations of LT inductive elements and LT capacitive elements may be measured and compared with the desired output impedance indicated by constant gain circles 612. The process of selecting combinations of capacitive and inductive load tracking elements may be performed iteratively, by trial-and-error, or by an intelligent selection process based on the results of a prior measurement. At the completion of operation 414, the output impedance resulting from the combination of capacitive and inductive load tracking element may be illustrated by output impedance 616. Output impedance 616 illustrates that the output impedances at points 628, 630, 632, 634 and 626 for frequencies of about 3 GHz, 5 GHZ, 7 GHz, 9 GHz and 10 GHz, respectively, and lies near a constant load circle for the associated frequency. Output impedance 616 illustrates that the impedance of the LT network tracks, at least in part, the required impedance for constant gain over the ultra wide band.

In operation 416, a resistive element may be added to the LT network to further improved load tracking. The resistive element may be added in parallel with the LT inductive element and LT capacitive element, which may further improve the tracking. Operation 416 may include repeating the impedance measurements of operation 412 and comparing the impedance of the LT network with the impedance at the constant gain circles until a good enough match is determined.

In other embodiments, combinations other than the combination illustrated by LT network 104 (FIG. 1) may be used for an LT network. For example, additional capacitive and inductive elements may be used in series with a resistive element, an inductive element and/or a capacitive element.

In operation 418, a common-gate stage may be added to the amplifier. Stage 106 (FIG. 1) is an example of a suitable common-gate stage. In operation 420, elements may be selected for the common-gate stage to compensate for a capacitive input of the cascode. In one embodiment, an inductive element, such as inductive element 124 (FIG. 1) and a resistive element, such as resistive element 122 (FIG. 1), may be selected to provide a match to the input of the cascode and provide at least a partially matched antenna input over a wide or ultra wide frequency band.

In operation 422, one or more additional amplification stages may be added to the amplifier. The one or more additional amplification stages may be resistor-based amplification stages, such as stages 108 (FIG. 1), and they may be added in a parallel or series arrangement as previously discussed. In operation 424, the amplifier design may be finalized and the amplifier may be fabricated with devices having the same or substantially similar S-parameters as the devices measured in operation 404.

Although the individual operations of procedure 400 are illustrated and described as separate operations, one or more of the individual operations may be performed concurrently and nothing requires that the operations be performed in the order illustrated.

Thus, an improved amplifier suitable for wide band and ultra wide band applications has been described. An ultra wide band amplifier with improved noise performance has also been described. An improved ultra wide band receiver has also been described. The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the invention embraces all such alternatives, modifications, equivalents and variations as fall within the spirit and scope of the appended claims.

What is claimed is:

1. An amplifier comprising:
    a common-gate (CG) amplifying element in a cascode with a common-source (CS) amplifying element;
    a load-tracking (LT) network at an output of the CG amplifying element to, at least in part, track a changing output impedance of the cascode over an ultra wide frequency band; and
    an input-matching stage comprising an input matching CG amplifying element and a drain-inductive element to produce a substantially matched input to the cascode over the ultra wide frequency band.

2. The amplifier of claim 1 wherein the LT network comprises a parallel combination of an LT capacitive element, an LT inductive element, and an LT resistive element.

3. The amplifier of claim 2 wherein values of the LT capacitive element, the LT inductive element and the LT resistive element are selected to, at least in part track, the changing output impedance of the cascode over the ultra wide frequency band to broaden an output response of the cascode within the frequency band providing substantially constant gain over the broadened response.

4. The amplifier of claim 3 wherein the ultra wide frequency band is at least approximately 3 to 10 GHz.

5. The amplifier of claim 2 wherein a source of the CG amplifying element is coupled to a drain of the CS amplifying element and a drain of the CG amplifying element is coupled to the LT network,
    wherein a gate of the CS amplifying element to receive an RF input signal, and the drain of the CG amplifying element to provide an amplified RF output signal within the ultra wide frequency band, and
    wherein the drain-inductive element is coupled to a drain of the input matching CG amplifying element to produce the substantially matched input for the CS amplifying element over the ultra wide frequency band.

6. The amplifier of claim 1 wherein the CG amplifying element, the CS amplifying element, and LT network comprise a second stage of the amplifier, the amplifier further comprising a first common-gate stage to provide an RF input signal to the cascode, the first stage comprising the input matching CG amplifying element.

7. An amplifier comprising:
    a common-gate (CG) amplifying element in a cascode with a common-source (CS) amplifying element; and
    a load-tracking (LT) network at an output of the CG amplifying element to, at least in part, track a changing output impedance of the cascode,
    wherein the CG amplifying elements, the CS amplifying element, and LT network comprise a second stage of the amplifier, the amplifier further comprising a first common-sate stage to provide an RF input signal to the cascode, the first stage comprising a first stage CG amplifying element, and
    wherein the amplifier further comprises a first stage inductive element and a first stage resistive element coupled to a drain of the first stage CG amplifying element selected at least in part to compensate for a capacitive input impedance of the cascode and to provide a substantially matched input to the amplifier over an ultra wide frequency band.

8. The amplifier of claim 6 further comprising at least one resistor-based amplifying stage after the cascode comprising a third stage CS amplifying element.

9. The amplifier of claim 6 further comprising a plurality of resistor-based amplification stages in a parallel configuration to provide amplified signals to corresponding mixing elements of a plurality of mixing elements, the mixing elements generating signals from a portion of the ultra wide frequency band.

10. An amplifier comprising:
    a common-gate (CG) amplifying element in a cascode with a common-source (CS) amplifying element; and
    a load-tracking (LT) network at an output of the CG amplifying element to, at least in part, track a changing output impedance of the cascode,
    wherein the LT network is comprises a parallel combination of an LT capacitive element, an LT inductive element, and an LT resistive element, wherein:
    the CS and CG amplifying elements comprise CMOS FETs having a width to length (W/L) ranging between approximately 45–50/0.09 ($\mu$m/$\mu$m);
    the LT inductive element has an inductance significantly greater than a parasitic inductance of a drain of the CG amplifying element;
    the LT inductive element has a value ranging from approximately 3 to 10 nH, the LT capacitive element has a value ranging from approximately 0.5 to 1.5 pF, and the LT resistive element has a value ranging from approximately 30 and 150 Ohms; and
    the LT inductive element, the LT capacitive element and the LT resistive element form a resonant circuit within the ultra wide frequency band.

11. The amplifier of claim 2 wherein the LT resistive element comprises either a polycrystalline resistor, an n-Well resistor or special layer integrated resistor, and the LT capacitive element is a metal-insulator-metal (MIM) capacitor fabricated on or near a surface of a semiconductor die comprising the amplifying elements.

12. An ultra wide band low noise amplifier (UWB LNA) comprising:
    a first stage comprising an input-matching common-gate (CG) amplifying element and a drain-inductive element selected to produce a substantially matched input impedance to the cascode over an ultra wide frequency band; and
    a second stage comprising CG amplifying element in a cascode with a common-source (CS) amplifying element, and a load-tracking (LT) network at an output of the CG amplifying element selected to, at least in part, track a changing output impedance of the cascode over the ultra wide frequency band the first stage to transform an the input impedance to the second stage.

13. An ultra wide band low noise amplifier (UWB LNA) comprising:
    a first stage comprising a first stage common-gate (CG) amplifying element;
    a second stage comprising CG amplifying element in a cascode with a common-source (CS) amplifying element, and a load-tracking (LT) network at an output of the CG amplifying element to, at least in part, track a changing output impedance of the cascode, the first stage to transform an input impedance to the second stage; and a plurality of third stage resistor-based CS amplifying elements to provide RF signals to a plurality of down converting elements for generation of a plurality of signals corresponding with portions of an ultra wide band frequency band.

14. The amplifier of claim 13 wherein the LT network comprises a parallel combination of an LT capacitive element, an LT inductive element, and an LT resistive element, and wherein values of the LT capacitive element, the LT inductive element and the LT resistive element are selected to, at least in part, track the changing output impedance of the cascode over an ultra wide frequency band broadening an output response of the cascode within the ultra wide frequency band.

15. An ultra wide band low noise amplifier (UWB LNA) comprising:

a first stage comprising a first stage common-gate (CG) amplifying element;

a second stage comprising CG amplifying element in a cascode with a common-source (CS) amplifying element, and a load-tracking (LT) network at an output of the CG amplifying element to, at least in part, track a changing output impedance of the cascode, the first stage to transform an input impedance to the second stage; and a first stage inductive element and a first stage resistive element coupled to a drain of the first stage CG amplifying element, the first stage inductive and resistive elements selected to, at least in part, compensate for a capacitive input impedance of the cascode and provide a substantially matched antenna input to the amplifier over the ultra wide frequency band.

16. The amplifier of claim 14 wherein:

the CS and CG amplifying elements comprise CMOS FETs having a width to length (W/L) ranging between approximately 45–50/0.09 ($\mu$m/$\mu$m);

the LT inductive element has an inductance significantly greater than a parasitic inductance of a drain of the CG amplifying element;

the LT inductive element has a value ranging from approximately 3 to 10 nH, the LT capacitive element has a value ranging from approximately 0.5 to 1.5 pF, and the LT resistive element has a value ranging from approximately 30 and 150 Ohms; and the LT inductive element, the LT capacitive element and the LT resistive element form a resonant circuit within the ultra wide frequency band.

17. The amplifier of claim 14 wherein the LT resistive element comprises either a polycrystalline resistor, an n-Well resistor or special layer integrated resistor, and the LT capacitive element is a metal-insulator-metal (MIM) capacitor fabricated on or near a surface of a semiconductor die comprising the amplifying elements.

18. A method of amplifying an RF signal in an ultra wide frequency band comprising:

transforming an antenna input impedance to a capacitive input impedance of a cascode with an input-matching common-gate (CG) amplifying element and a drain-inductive element to produce a substantially matched input impedance to the cascode over the ultra wide frequency band, the cascode comprising a common-gate (CG) amplifying element in a cascode with a common-source (CS) amplifying element;

amplifying the RF signal with the cascode; and tracking, at least in part, a changing output impedance of the cascode for frequencies in the ultra wide frequency band, wherein tracking comprises tracking with a load tracking (LT) network having component values selected to track, at least in part, the changing output impedance over the ultra wide frequency band.

19. The method of claim 18 wherein the LT network comprises a parallel combination of an LT capacitive element, an LT inductive element, and an LT resistive element, and wherein values of the LT capacitive element, the LT inductive element and the LT resistive element are selected to, at least in part, track the changing output impedance of the cascode over the ultra wide frequency band to broaden an output response of the cascode in the frequency band, and wherein a value of the drain-inductive element is selected to produce a substantially matched input impedance to the cascode over the ultra wide frequency band.

20. A method of amplifying an RF signal in an ultra wide frequency band comprising:

transforming an antenna input impedance to a capacitive input impedance of a cascode, the cascode comprising a common-gate (CG) amplifying element in a cascode with a common-source (CS) amplifying element;

amplifying the RF signal with the cascode; and tracking, at least in part, a changing output impedance of the cascode for frequencies in the ultra wide frequency band, wherein tracking comprises tracking the changing output impedance, at least in part, with a load tracking (LT) network, the LT network comprising a parallel combination of an LT capacitive element, an LT inductive element, and an LT resistive element, and wherein values of the LT capacitive element, the LT inductive element and the LT resistive element are selected to, at least in part, track the changing output impedance of the cascode over the ultra wide frequency band to broaden an output response of the cascode in the frequency band, and wherein transforming comprises transforming the antenna input with a first common-gate stage of an amplifier to provide an RF input signal to the cascode, the first stage comprising of a first stage CG amplifying element, a first stage inductive element and a first stage resistive element, the first stage inductive and resistive elements coupled to a drain of the first stage CG amplifying element and selected to, at least in part, compensate for a capacitive input impedance of the cascode and to provide a substantially matched antenna input over the ultra wide frequency band.

21. The method of claim 20 further comprising:

further amplifying the RF signal with one or more third resistor-based amplification stages comprising a third stage CS amplification element; and providing the further amplified RF signal to one or more down converting elements to generate signals corresponding with portions of the ultra wide frequency band.

22. A receiver system comprising:

a dipole antenna to receive an RF signal within an ultra wide band frequency band;

a ultra wide band low noise amplifier (UWB LNA) to amplify the RF signal; and a plurality of down converting elements to generate signals corresponding with portions of the ultra wide frequency band, wherein the amplifier comprises a common-gate (CG) amplifying element in a cascode with a common-source (CS) amplifying element, and a load-tracking (LT) network at an output of the CG amplifying element to, at least in part, track a changing output impedance of the cascode to help provide substantially constant gain over the ultra wide frequency band.

23. The receiver system of claim 22 wherein the LT network comprises a parallel combination of an LT capacitive element, an LT inductive element, and an LT resistive element, and wherein values of the LT capacitive element, the LT inductive element and the LT resistive element are selected to, at least in part, track the changing output impedance of the cascode over the ultra wide frequency band to broaden an output response of the cascode within the frequency band.

24. The receiver system of claim 22 wherein the amplifier further comprises a first stage comprising a first stage common gate (CG) amplifying element, a first stage inductive element and a first stage resistive element, the first stage inductive and resistive elements coupled to a drain of the first stage CG amplifying element, the first stage inductive and resistive elements selected to, at least in part, compensate for a capacitive input impedance of the cascode and provide a substantially matched antenna input to the amplifier over the ultra wide frequency band.

25. The receiver system of claim 22 further comprising:
a plurality of detectors to detect signals provided by the down converting elements; and
a decoder to generate a bit stream from the detected signals,
wherein the amplifier, down converting elements, detectors and decoder are fabricated on a single semiconductor chip.

26. A method of designing an ultra wide band low noise amplifier comprising:
measuring S-parameters of a semiconductor device;
modeling a common-gate (CG) amplifying element in a cascode with a common-source (CS) amplifying element using the S-parameters;
using the model to determine output impedances of the cascode to achieve a desired gain for selected frequencies of an ultra wide frequency band; and
selecting elements of a load-tracking (LT) network at an output of the CG amplifying element to, at least in part, track a changing output impedance of the cascode,
wherein modeling comprises generating constant gain circles for the selected frequencies of the frequency band, each constant gain circle defining changing output impedances of the cascode for the desired gain for one of the selected frequencies,
wherein the LT network comprises a parallel combination of an LT capacitive element, an LT inductive element, and an LT resistive element,
wherein selecting comprises:
selecting initial values for the LT inductive element and LT capacitive element;
measuring the output impedance of the cascode with the initial values of the LT inductive element and LT capacitive element;
comparing the measured output impedance with the desired output impedances at the selected frequencies; and
based on the comparison, further selecting values for the LT inductive element and LT capacitive element to reduce a difference between the measured LT network's output impedance and the desired output impedances at the selected frequencies,
wherein the method further comprises selecting the LT resistive element to flatten an output response of the cascode over the frequency band.

27. The method of claim 26 wherein further selecting values further comprises selecting values for the LT inductive element and the LT capacitive element to help achieve a substantially constant gain over the ultra wide frequency band, the ultra wide frequency band ranging at least approximately 3 to 10 GHz.

28. A method of designing an ultra wide band low noise amplifier comprising:
measuring S-parameters of a semiconductor device;
modeling a common-gate (CG) amplifying element in a cascode with a common-source (CS) amplifying element using the S-parameters;
using the model to determine output impedances of the cascode to achieve a desired gain for selected frequencies of an ultra wide frequency band; and
selecting elements of a load-tracking (LT) network at an output of the CG amplifying element to, at least in part, track a changing output impedance of the cascode,
wherein modeling comprises generating constant gain circles for the selected frequencies of the frequency band, each constant gain circle defining changing output impedances of the cascode for the desired gain for one of the selected frequencies,
wherein the LT network comprises a parallel combination of an LT capacitive element, an LT inductive element, and an LT resistive element,
wherein selecting comprises:
selecting initial values for the LT inductive element and LT capacitive element;
measuring the output impedance of the cascode with the initial values of the LT inductive element and LT capacitive element;
comparing the measured output impedance with the desired output impedances at the selected frequencies; and
based on the comparison, further selecting values for the LT inductive element and LT capacitive element to reduce a difference between the measured LT network's output impedance and the desired output impedances at the selected frequencies,
wherein the method further comprises:
adding a first common-gate stage to provide an RF input signal to the cascode, the first stage being a common-gate stage comprising a first stage CG amplifying element; and
selecting a first stage inductive element and a first stage resistive element coupled to a drain of the first stage CG amplifying element, the first stage to, at least in part, compensate for a capacitive input impedance of the cascode and provide a substantially matched input to the amplifier over the ultra wide frequency band.

29. The method of claim 28 further comprising:
adding one or more resistor-based CS amplification stages to the amplifier;
measuring the frequency response of the amplifier over the ultra wide frequency band; and
further adjusting values of the elements of the LT network to improve frequency response.

30. An amplifier comprising:

a single transistor amplifying element;

a load-tracking (LT) network at an output of the single transistor amplifying element to, at least in part, track a changing output impedance of the single transistor amplifying element, the LT network comprising a parallel combination of an LT capacitive element, an LT inductive element, and an LT resistive element;

a first common-gate stage to provide an RF input signal to the single transistor amplifying element, the first stage comprising a first stage CG amplifying element, a first stage inductive element and a first stage resistive element coupled to a drain of the first stage CG amplifying element selected at least in part to compensate for a capacitive input impedance of the single transistor amplifying element and to provide a substantially matched input to the amplifier over the ultra wide frequency band; and at least one resistor-based amplifying stage after the single transistor amplifying element comprising a third stage CS amplifying element.

* * * * *

UNITED STATES PATENT AND TRADEMARK OFFICE
CERTIFICATE OF CORRECTION

PATENT NO. : 6,806,777 B2
DATED : October 19, 2004
INVENTOR(S) : Franca-Neto

It is certified that error appears in the above-identified patent and that said Letters Patent is hereby corrected as shown below:

Title page,
Item [57], ABSTRACT,
Line 7, after "include" delete "of".

Column 9,
Line 62, delete "elements" and insert -- element --, therefor.
Line 65, delete "common-sate" and insert -- common-gate --, therefor.

Column 10,
Line 23, after "network" delete "is".
Line 37, delete "30 and 150" and insert -- 30 to 150 --, therefor.
Line 60, after "transform" delete "an".

Column 11,
Line 9, delete "band" before "frequency".
Line 50, delete "30 and 150" and insert -- 30 to 150 --, therefor.

Column 12,
Lines 6-7 and 34, delete "load tracking" and insert -- load-tracking --, therefor.
Line 65, after "wide" delete "band".

Column 13,
Line 22, delete "common gate" and insert -- common-gate --, therefor.
Line 62, delete "cascade" and insert -- cascode --, therefor.

Column 14,
Line 29, delete "pain" and insert -- gain --, therefor.

Signed and Sealed this

Twenty-fourth Day of May, 2005

JON W. DUDAS
*Director of the United States Patent and Trademark Office*